(12) United States Patent
Ide et al.

(10) Patent No.: US 7,528,325 B2
(45) Date of Patent: May 5, 2009

(54) KEY SHEET MODULE

(75) Inventors: Hidehiko Ide, Fujiyoshida (JP); Isao Miyashita, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 265 days.

(21) Appl. No.: 11/509,081

(22) Filed: Aug. 24, 2006

(65) Prior Publication Data
US 2007/0074903 A1   Apr. 5, 2007

(30) Foreign Application Priority Data
Aug. 24, 2005   (JP) .......................... P2005-242289

(51) Int. Cl.
*H05K 1/03* (2006.01)
(52) U.S. Cl. .................. 174/255; 174/262; 361/767
(58) Field of Classification Search ............ 174/255, 174/262; 200/314; 361/767
See application file for complete search history.

(56) References Cited
U.S. PATENT DOCUMENTS

| 4,841,633 | A | * | 6/1989 | Kinugawa | ................... 29/837 |
| 4,933,522 | A | * | 6/1990 | Celander | ................... 200/513 |
| 5,664,667 | A | * | 9/1997 | Kenmochi | ................... 200/314 |
| 6,353,189 | B1 | * | 3/2002 | Shimada et al. | ............. 174/255 |
| 7,034,232 | B2 | | 4/2006 | Ide et al. | |
| 2006/0180344 | A1 | * | 8/2006 | Ito et al. | ..................... 174/262 |

FOREIGN PATENT DOCUMENTS

| JP | 03-216923 A | 9/1991 |
| JP | 09-232753 A | 9/1997 |
| JP | 2005-71808 | 3/2005 |

* cited by examiner

*Primary Examiner*—Tuan T Dinh
*Assistant Examiner*—Andargie M Aychillhum
(74) *Attorney, Agent, or Firm*—Browdy and Neimark, P.L.L.C.

(57) ABSTRACT

A key sheet module comprising a single-sided printed wiring board including a front surface on which a plurality of wiring patterns are provided and a plurality of holes provided at predetermined positions, rear-surface connection parts for the wiring patterns being exposed from the holes on a rear surface of the single-sided printed wiring board, an insulating layer provided on the front surface of the single-sided printed wiring board and having openings, patterns for switching of the wiring patterns and front-surface connection parts of the wiring patterns being exposed in the openings, the front-surface connection parts being connected by a front-surface jumper and the rear-surface connection parts being connected by a rear-surface jumper, respectively.

12 Claims, 7 Drawing Sheets

KEY SHEET MODULE

CROSS-REFERENCE TO THE RELATED APPLICATION

This application is based on and claims priority from Japanese Patent Application No. 2005-242289, filed on Aug. 24, 2005, the disclosure of which is incorporated herein by reference in its entirety.

BACKGROUND OF THE INVENTION

1. Field of the Invention

The present invention relates to a key sheet module used in an operational key section of a compact electronic instrument such as a mobile phone or the like, more specifically to a key sheet module capable of applying a complicated circuit to a single-sided printed wiring board on which wiring patterns are formed only on one side of the board.

2. Description of Related Art

In compact electronic instruments such as mobile phones or the like, it has been conventional practice to use a key sheet module including a printed wiring board, electric elements such as a chip-type LED, a resistor, a capacitor and a dome-like contact spring which are mounted on the printed wiring board, and a fixation sheet which fixes the contact spring and covers the electric elements.

While it is necessary that some electric elements such as the LED, the resistor, the capacitor or the like be mounted on the printed wiring board, of the key sheet module, it is also required for the key sheet module to be made smaller and thinner to meet the demands to reduce in size and thickness of instruments in which the key sheet module is installed. Therefore, a two-sided printed wiring board provided with wiring patterns on front and back surfaces, or a multiple-layer board making use of insulating layers to form wiring patterns in a multilayered state has been adopted to deal with a complicated circuit structure.

However, because the two-sided printed wiring board or multiple-layer board is expensive, a way of dealing with a complicated circuit structure has been proposed in which jumpers configured to connect remote wiring patterns skipping adjacent wiring patterns are mounted on an inexpensive single-sided printed wiring board (for reference, see Japanese Patent Laid-Open No. 2005-71808).

FIG. 10 illustrates a conventional key sheet module having a structure in which wiring patterns disposed on a single-sided printed wiring board are connected through jumpers. As shown in FIG. 10, a plurality of wiring patterns 4a, 4b, and 4c are provided only on an upper surface of the single-sided printed wiring board 2 at predetermined intervals.

To electrically connect the wiring patterns 4a and 4c by a jumper 8 which comprises a conductive paste and is formed by printing, an insulating layer 6 is disposed on the wiring pattern 4b to be insulated between the wiring patterns 4a and 4c, and the jumper 8 to connect the wiring patterns 4a and 4c is disposed to straddle the wiring pattern 4b and the insulating layer 6 disposed on the wiring pattern 4b.

An insulating coat 10 is formed on the jumper 8 by printing. The provision of the jumper 8 makes it possible to deal with a more complicated circuit structure even in the single-sided printed wiring board 2.

However, in recent years, even more complicated circuit structures have become necessary, because it is difficult to secure space to provide a number of jumpers on the single-sided printed wiring board.

SUMMARY OF THE INVENTION

An objective of the present invention is to provide a key sheet module capable of dealing with a complicated circuit structure even if a single-sided printed wiring board is used.

To accomplish the above objective, a key sheet module according to one embodiment of the present invention comprises a single-sided printed wiring board including a front surface on which a plurality of wiring patterns are provided and a plurality of holes provided at positions corresponding to rear-surface connection parts for the wiring patterns, at least one contact spring disposed on the wiring patterns for switching of the wiring patterns, an insulating layer which has openings provided at positions corresponding to spaces for contact springs and for front-surface jumpers comprising a first jumper and a second jumper, respectively, a fixation sheet to cover a surface of each the contact springs, the front-surface jumper to electrically connect the front-surface connection parts of the wiring patterns exposed in the openings of the insulating layer, and a rear-surface jumper to electrically connect the rear-surface connection parts of the wiring patterns exposed in the holes from a rear-surface of the single-sided printed wiring board.

A key sheet module according to another embodiment of the present invention comprises a single-sided printed wiring board including a front surface on which a plurality of wiring patterns are provided, at least one contact spring disposed on the wiring patterns for switching of the wiring patterns, an insulating layer which has openings provided at positions corresponding to spaces for contact springs and for front-surface jumpers comprising a first and a second jumpers respectively, a fixation sheet to cover a surface of each of the contact springs, the first jumper to electrically connect the first connection parts exposed in the openings of the insulating layer, a first overcoat having an insulation property and configured to cover the first jumper, and the second jumpers provided on the first overcoat and configured to electrically connect the second connection parts exposed in the openings of the insulating layer.

With the above structure, it is possible to greatly increase the number of wiring pattern jumper connections and deal with a more complicated circuit structure. In particular, because the front-surface jumpers and the rear-surface jumpers can be arranged to partly or fully overlap as viewed in a plan view, it is possible to achieve a high degree of freedom in the arrangement of the jumpers and ease of circuit design, and to prevent an increase in board size due to the increased number of jumpers.

DETAILED DESCRIPTION OF THE PREFERRED EMBODIMENTS

Figure 1:
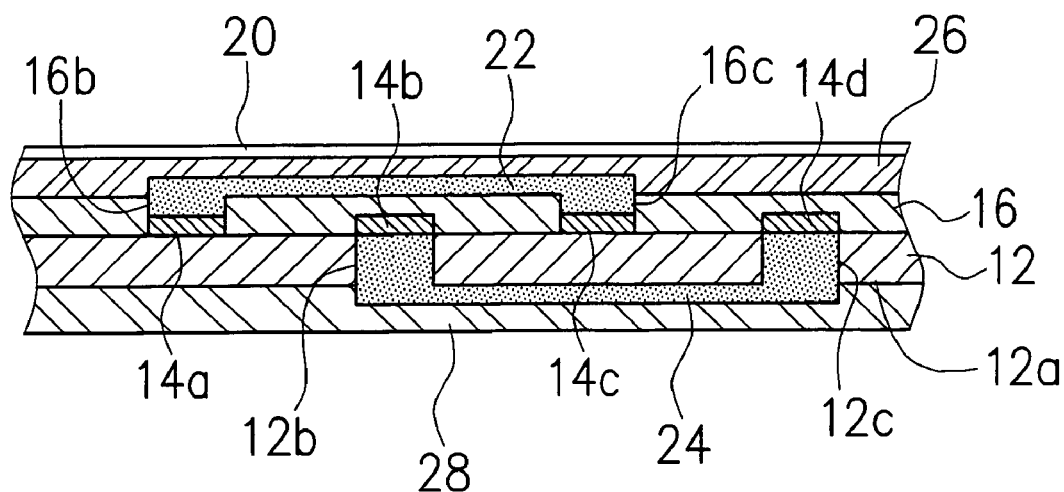
FIG. 1 is an enlarged sectional view showing a main part of a key sheet module according to a first embodiment of the present invention.

Preferred embodiments of the present invention will be explained in detail with reference to the accompanying drawings below.

In general structure, a key sheet module according to the present invention employs a single-sided printed wiring board, for which wiring patterns are provided only on a front surface. A plurality of holes are provided at predetermined positions on the single-sided printed wiring board. Rear-surface connection parts for the wiring patterns are configured to be exposed in the holes from a rear-surface of the single-sided printed wiring board. An insulating layer having openings is provided on a front surface of the single-sided printed wiring board, and patterns on which a contact spring is to be provided for switching of the wiring patterns and front-surface connection parts are exposed in the openings.

The front-surface connection parts are connected through a front-surface jumper and the rear-surface connection parts are connected through a rear-surface jumper.

Another form of a key sheet module according to the present invention is configured to have a front-surface connection parts comprising a first and a second connection parts exposed in openings of an insulating layer provided on a front surface of a single-sided printed wiring board.

The first connection parts are connected through the first jumper which is covered by a first overcoat.

The second connection parts are connected through the second jumper which is formed on the first overcoat.

As mentioned above, the wiring patterns or connection parts are connected through the front-surface jumper and the rear-surface jumper or overlapped first and second jumpers, and of course a plurality of jumpers and a combination the first and the second jumpers, and the rear-surface jumpers may be used for the single-sided printed wiring board, thereby allowing an increase in connection parts, even in the single-sided printed wiring board.

A first embodiment of a key sheet module according to the present invention is shown, referring to FIGS. 1 to 7. The key sheet module in the first embodiment, shown in FIGS. 1 to 6, includes a single-sided printed wiring board 12 having a base 12*a* which is made of a flexible film with an insulation property such as polyimide film or polyethylene terephthalate film or the like, and complicated wiring patterns 14 formed on a front surface of the base 12*a*. The wiring patterns 14 are disposed in a complicated form as shown partially in a plan view of FIG. 3.

Each of the wiring patterns 14 includes a circular central pattern 14*f* and a circumferential pattern 14*e* which is disposed to surround the central contact 14*f*. A plurality of springs (not shown), each of which it to be disposed on each of the circumferential patterns 14*e* over each of the central pattern 14*f*. Above each of the springs, a key (not shown) may be provided. In addition, a thin line pattern 14*g* is provided to connect each central pattern 14*f* and each circumferential pattern 14*e*.

A plurality of small holes 12*b* and 12*c* are formed in the single-sided printed wiring board 12. The holes 12*b* and 12*c* are formed in advance in the base 12*a* by a pre-punching method. The holes 12*b* and 12*c* are formed to pass through the base 12*a*. The wiring patterns 14 are formed using copper foil on portions of the base 12*a* where the holes are disposed. Rear-surface connection parts configured to connect at the rear-surface of the wiring patterns 14 provided on the surface of the base 12*a* are exposed in the holes 12*b* and 12*c* from the rear-surface of the base.

For example, as shown in FIG. 1, when connecting the wiring patterns 14*b* and 14*d*, the holes are provided directly below the wiring patterns 14*b* and 14*d* to allow exposure of a part of the wiring patterns 14*b* and 14*d* in the holes 12*b* and 12*c* at the rear-surface of the base 12*a*.

Reference number 16 shows an insulating layer which is printed or film-formed on the single-sided printed wiring board to cover the wiring patterns 14. The insulating layer 16 includes portions corresponding to the patterns 14*e* and 14*f* for switching of the wiring patterns 14, portions corresponding to front connection parts of the wiring patterns 14 configured to make connection at a front surface of the base 12*a* and large and small openings 16*a*, 16*b*, 16*c*, 16*d* provided at positions for mounting chips such as an LED, a resistor or the like on the wiring patterns 14.

Figure 2:
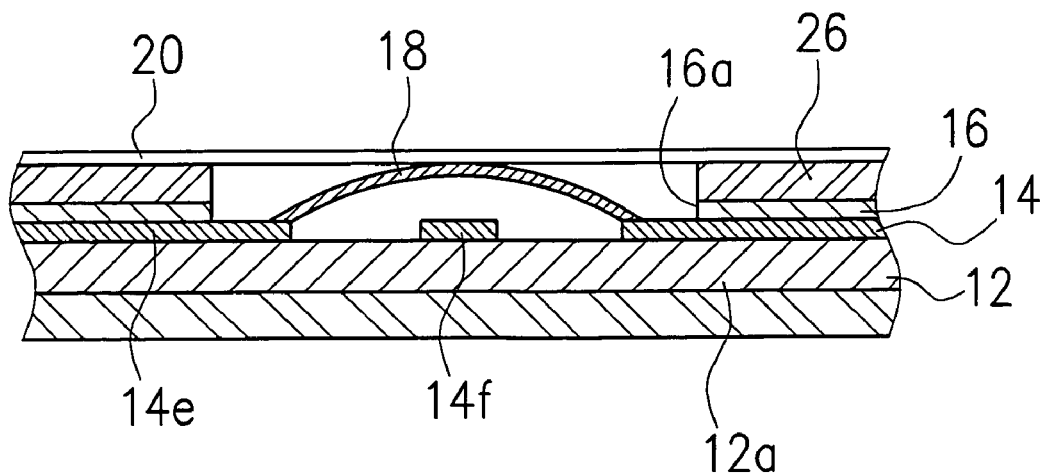
FIG. 2 is an enlarged sectional view showing a key portion of the key sheet module shown in FIG. 1.
Figure 3:
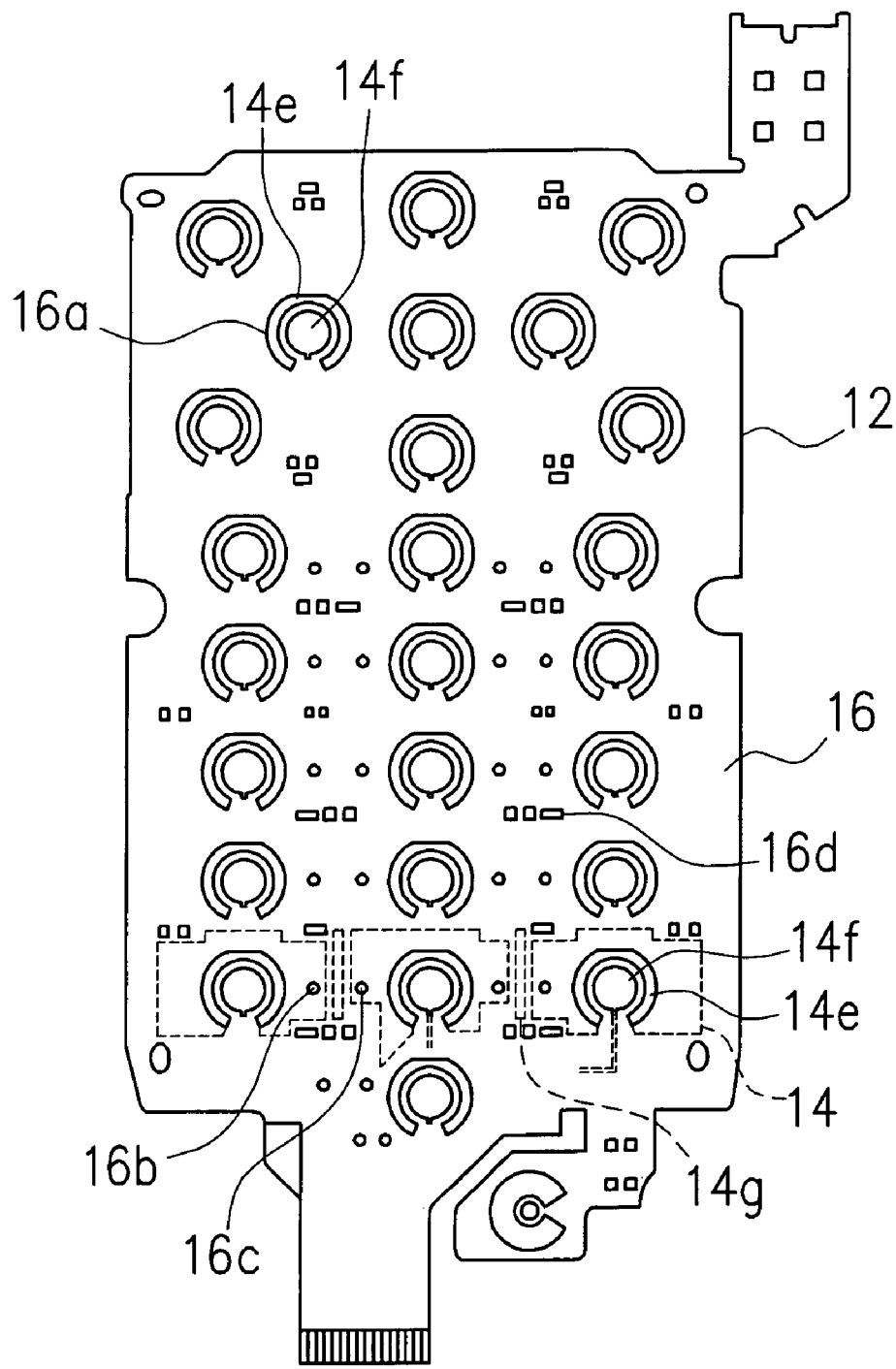
FIG. 3 is a plan view showing a single-sided printed wiring board covered by an insulating layer.

Each of the openings 16*a* is formed in a generally circular shape having a diameter that allows fitting of a contact spring 18 which is described hereinafter, as shown, for example, in FIG. 2. Moreover, each of the openings 16*b* and 16*c* is of a small circular shape and formed at a position corresponding to each of the connection parts for the wiring patterns 14*a* and 14*c* disposed at an interval across the wiring pattern 14*b*, as shown, for example, in FIG. 1. Here, in the case of a key sheet module used for a mobile phone or the like, the diameter of the small circular shape may be set to be about 1 mm.

The contact spring 18 is made of a metal having electric conductivity and has a dome-like shape, and is mounted on the pattern 14*e* in the opening 16*a* of the insulating layer 16. The contact spring 18 has a central portion which becomes deflated and inverted when the contact spring is depressed, and makes contact with the central contact 14*f*, thus allowing electrical conduction between the patterns 14*e* and 14*f* for switching. In addition, when depression of the contact spring 18 is stopped, the contact spring 18 returns to an original shape through elasticity to allow the patterns 14*e* and 14*f* for switching to be in a non-electric-conducting state.

Reference number 20 shows a sheet for fixation configured to fix the contact spring 18. The fixation sheet 20 is fixed to the upper surface of the single-sided printed wiring board 12 to cover the contact spring 18. In this first embodiment, the fixation sheet 20 is fixed onto a front-surface overcoat 26 which is described hereinafter.

Reference number 22 shows a front-surface jumper, which is formed by a conductive paste disposed in the openings 16*b* and 16*c* of the insulating layer 16 and on the front surface of the insulating layer by printing to connect the wiring patterns 14*a* and 14*c*. The provision of the front-surface jumper 22 allows the wiring patterns 14*a* and 14*c* to be connected through the front-surface jumpers 22 in such a manner that the wiring patterns 14*a* and 14*c* straddle the wiring pattern 14*b*, as shown, for example, in FIG. 1.

Reference number 24 shows a rear-surface jumper, which is formed by conductive paste disposed in the holes 12*b* and 12*c* of the single-sided printed wiring board 12 and on the rear-surface of the single-sided printed wiring board to connect the wiring patterns 14*b* and 14*d*. The provision of the rear-surface jumper 24 allows the wiring patterns 14*b* and 14*d* to be electrically connected through the rear-surface jumpers 24 in such a manner that the wiring patterns 14b and 14d straddle the wiring pattern 14c, as shown, for example, in FIG. 1.

Figure 4:
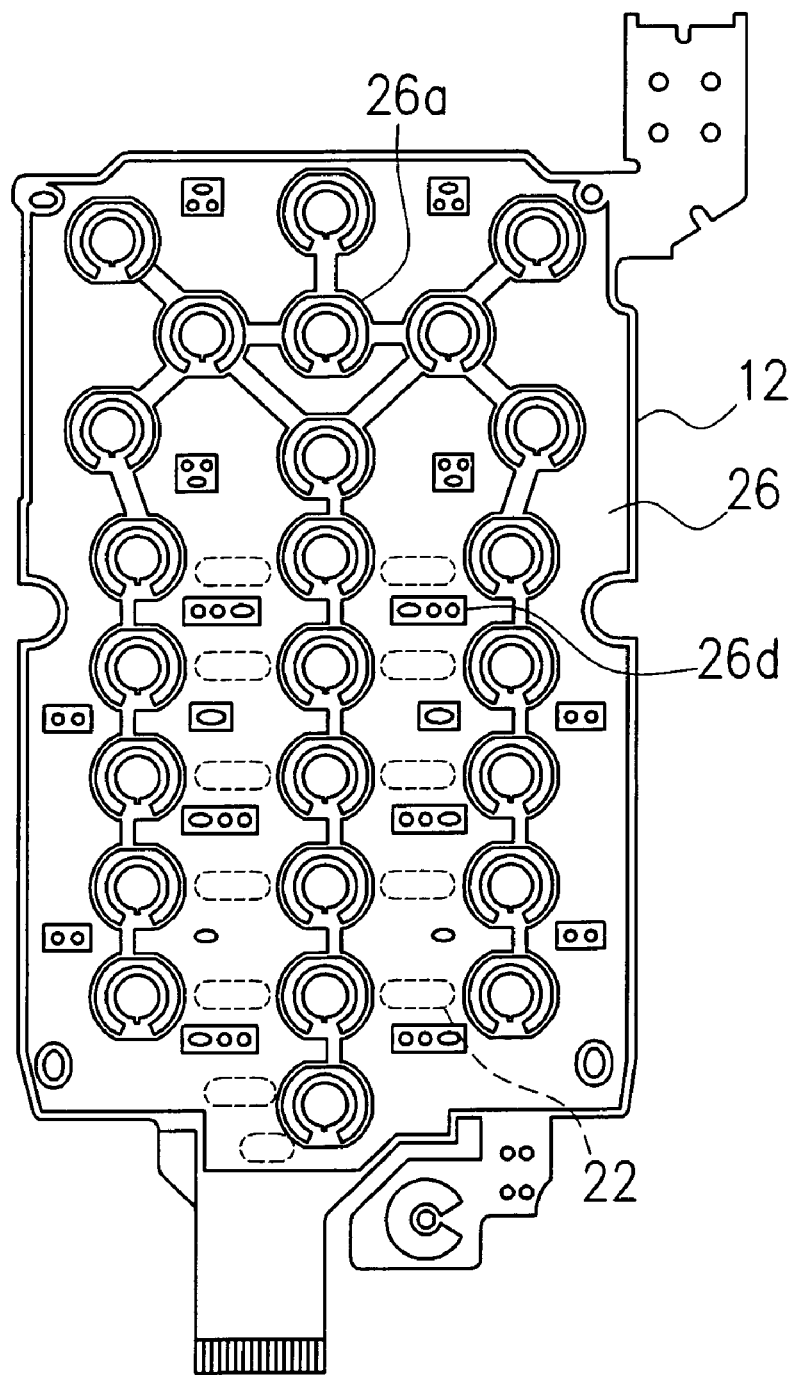
FIG. 4 is a plan view showing the single-sided printed wiring board covered by a front-surface overcoat.
Figure 5:
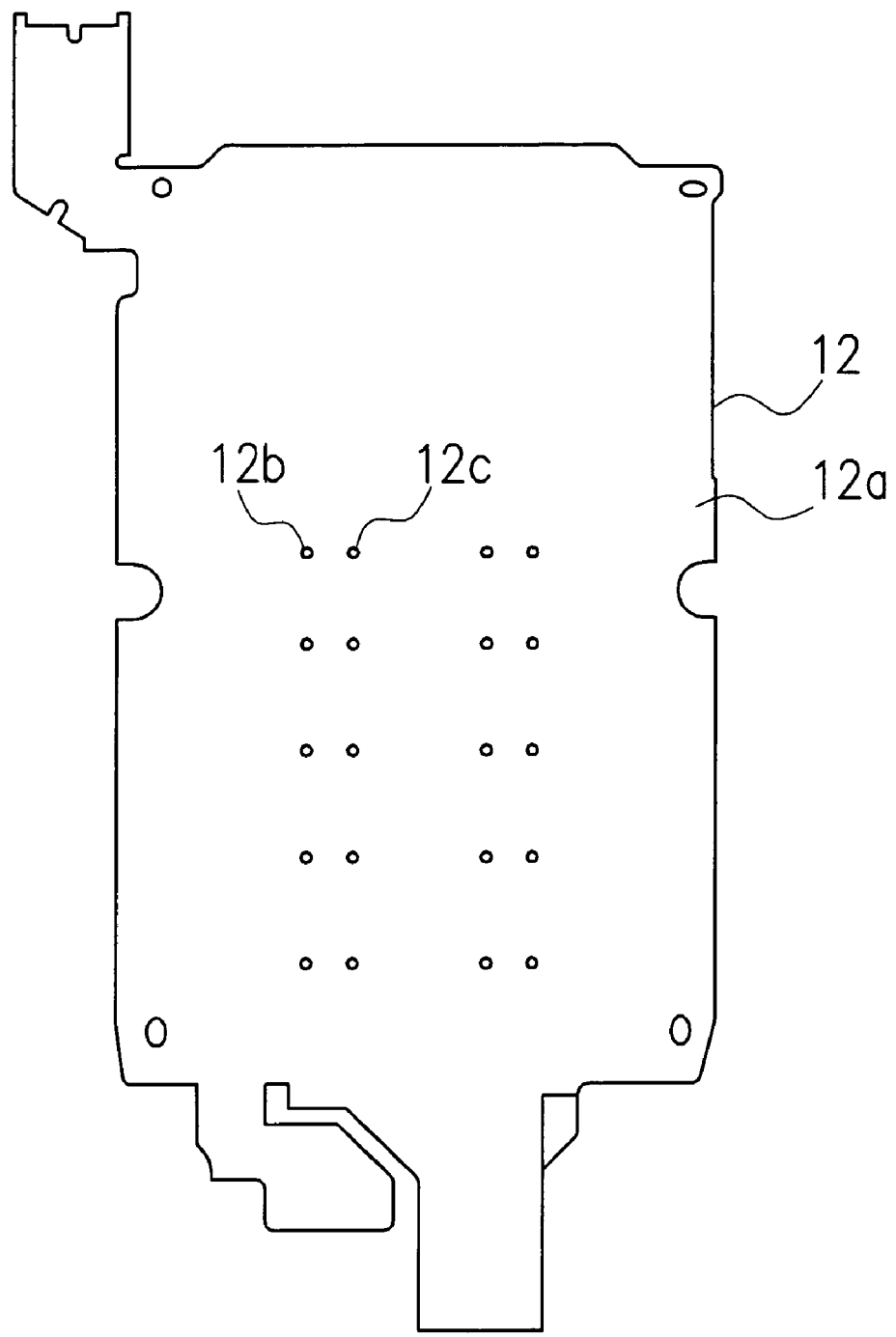
FIG. 5 is a back side view of the single-sided printed wiring board.

Reference number 26 shows a front-surface overcoat having an insulation property, which is formed on the front-surface jumper 22 by printing. The front-surface overcoat 26 in this first embodiment is configured to prevent electrical conduction between the front-surface jumper 22 and other circuit parts and so on. In addition, the front-surface overcoat 26 is disposed to cover the almost the entire surface of the single-sided printed wiring board 12 to more securely insulate the wiring patterns 14 covered by the insulating layer 16, as shown in FIG. 4. Openings 26a and 26d are provided at positions of the front-surface overcoat 26 corresponding to the openings 16a and 16d of the insulating layer 16.

Meanwhile, the front-surface overcoat 26 in this embodiment functions as a spacer between the single-sided printed wiring board 12 and the fixation sheet 20 to allow a depression distance sufficient to generate a clicking sensation in the contact spring 18.

Reference number 28 shows a rear-surface overcoat having an insulation property, which is formed on the rear-surface jumpers 24 by printing.

Figure 6:
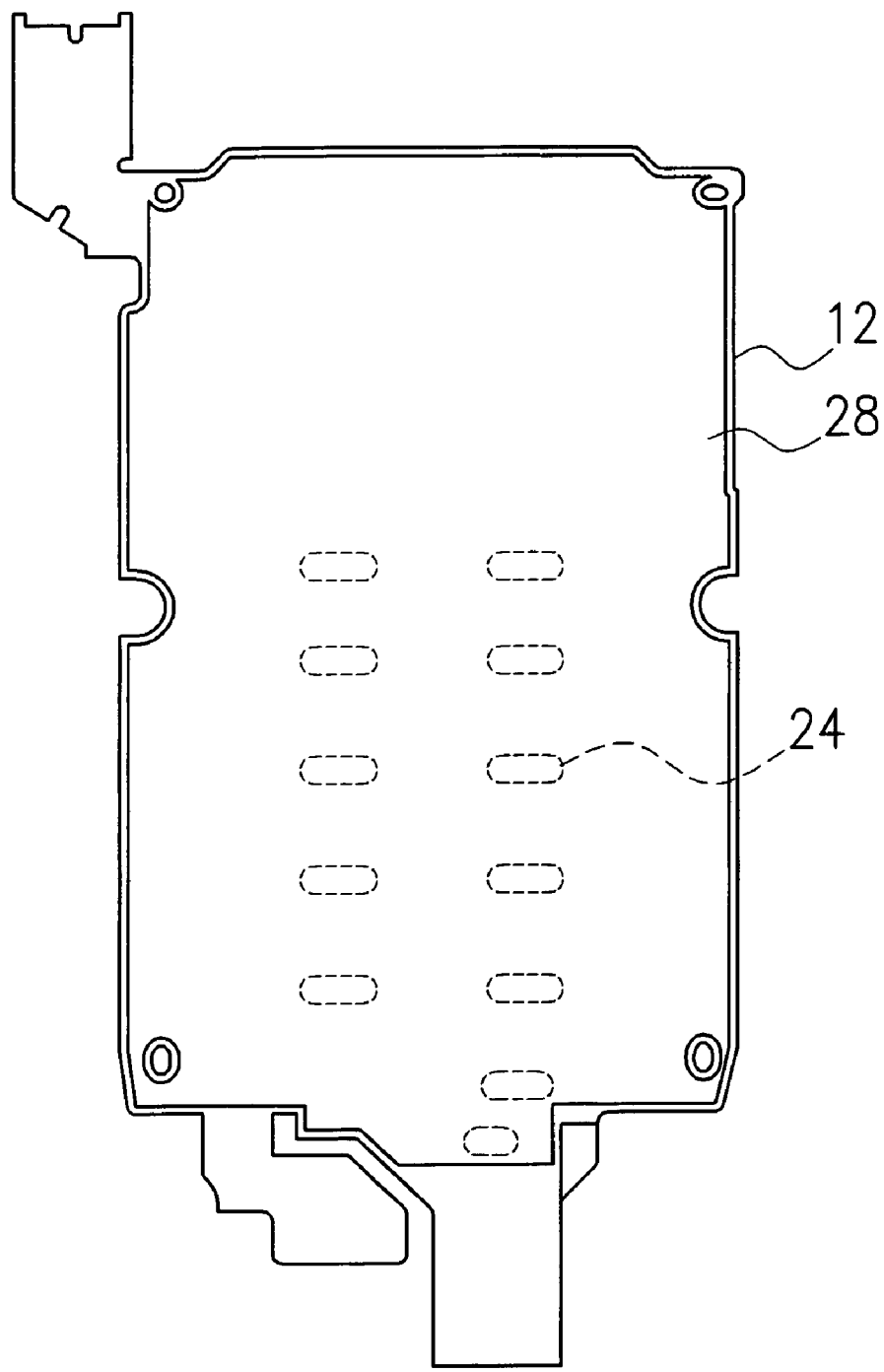
FIG. 6 is a back side view showing the single-sided printed wiring board covered by a back-side overcoat.

The rear-surface overcoat 28 in this first embodiment is formed to cover almost the entire rear surface of the single-sided printed wiring board 12, similarly to the front-surface overcoat 26, as shown in FIG. 6. The front-surface jumper 22 and the rear-surface jumpers 24 which have the above-mentioned structure in the key sheet module in this first embodiment can be disposed as shown in FIG. 7.

Figure 7:
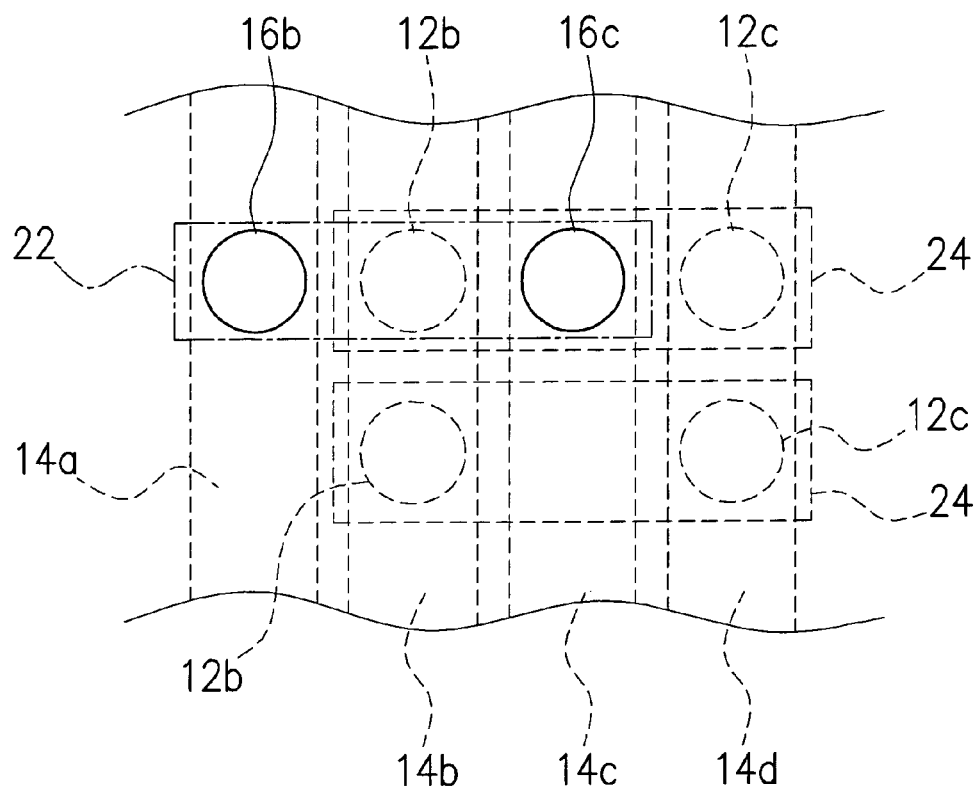
FIG. 7 is an explanatory view showing positions of the jumpers and so on with the single-sided printed wiring board viewed through the insulating layer from a plan.

FIG. 7 illustrates positions of the jumpers and so on when the single-sided printed wiring board 12 is viewed through the insulating layer 16 in a top plan view. In this first embodiment, when the wiring patterns 14a and 14b of the closely disposed wiring patterns 14a, 14b, 14c and 14d are connected through the front-surface jumper 22 and the wiring patterns 14b and 14d are connected through the rear-surface jumpers 24, the front-surface jumper 22 and the rear-surface jumpers 24 can be disposed to overlap in a plan view, as shown in FIG. 7. In this case, the openings 16b, 16c of the insulating layer 16 and the holes 12b, 12c of the single-sided printed wiring board 12 are disposed in a line.

It is also optional to set each front-surface jumper 22 and each rear-surface jumper 24 to deviate slightly from each other through a slight misalignment of the positions of the holes 12b and 12c. An alternative option is to set the rear-surface jumper 24 to provide additional connection between the wiring patterns 14a or 14c to which the front-surface jumper 22 is connected and the other wiring patterns. In particular, because the position of the rear-surface jumper 24 is not limited by the arrangement of keys or LEDs or the like, it is possible to freely set a position of the rear-surface jumper 24 to provide greater freedom in circuit design.

Although this first embodiment shows mainly the alternate connection of the wiring patterns 14 using the front-surface jumper 22 and the rear-surface jumper 24, it is, of course, also possible to skip some wiring patterns when connecting the wiring patterns by each jumper.

Figure 8:
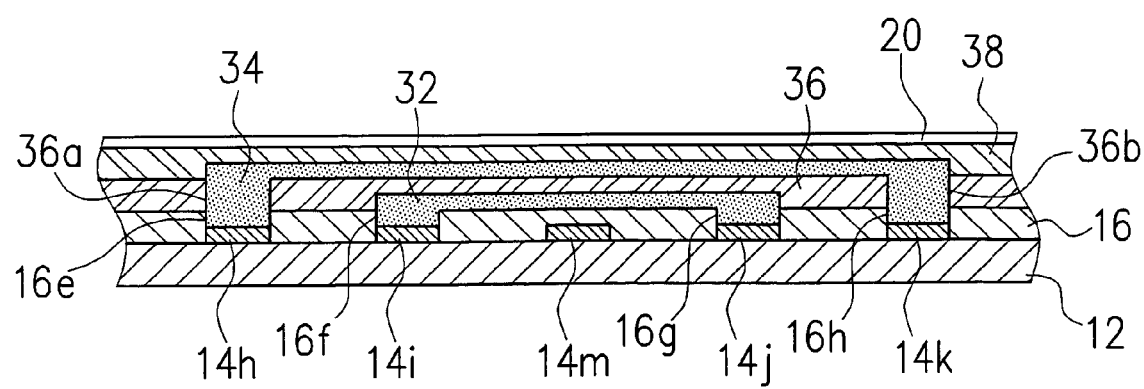
FIG. 8 is an enlarged sectional view showing a main part of a key sheet module according to a second embodiment of the present invention.
Figure 9:
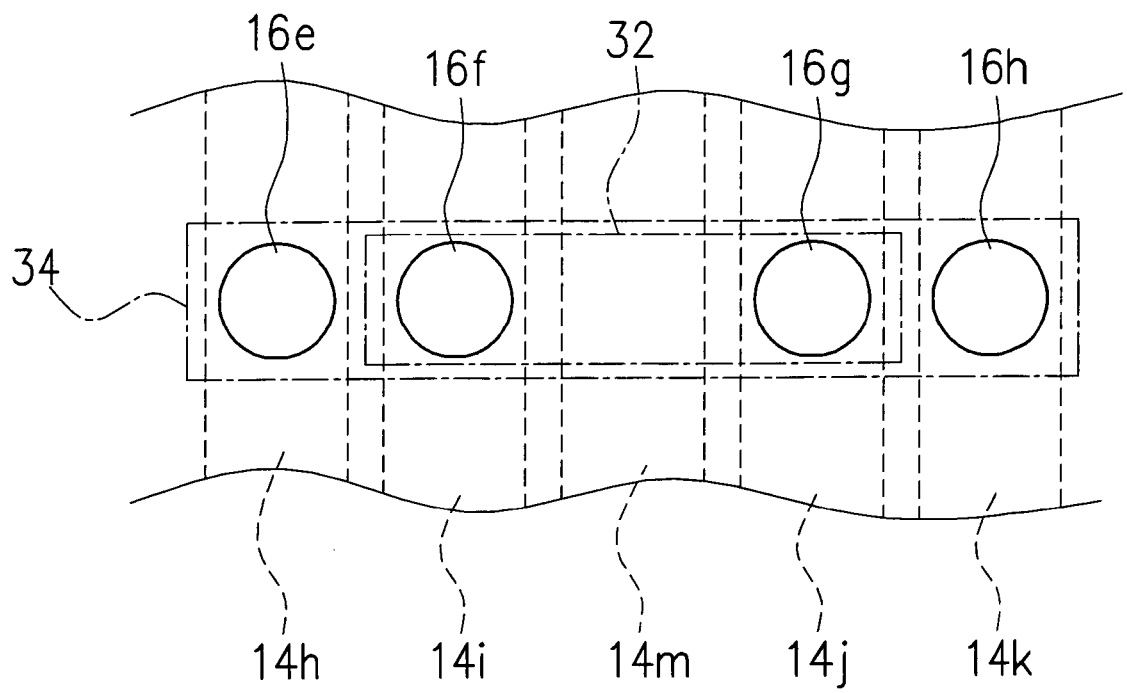
FIG. 9 is an explanatory view showing positions of the jumpers and so on with the single-sided printed wiring board shown in FIG. 8 viewed through the insulating layer from a plan.
Figure 10:
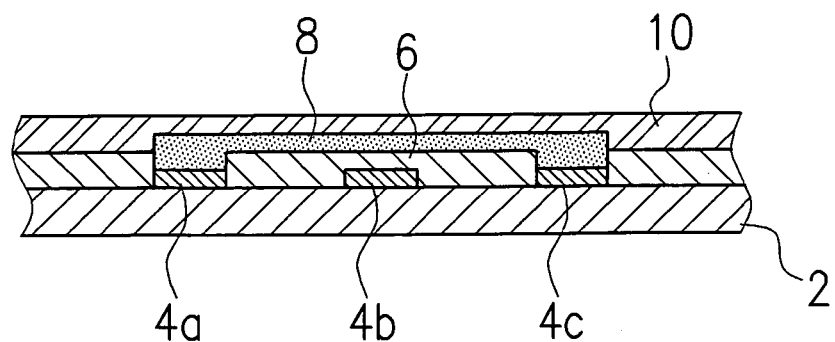
FIG. 10 is an enlarged sectional view showing a main part of a conventional key sheet module.

FIG. 8 illustrates a key sheet module according to a second embodiment of the present invention. FIG. 9 illustrates positions of the jumpers and so on when the single-sided printed wiring board 12 is viewed through the insulating layer 16 in a top plan view.

In this second embodiment, the number of jumper connections is increased by providing a first jumper 32 and a second jumper 34 configured to overlap in a plan view on a surface of the single-sided printed wiring board 12. Here, because a basic structure of the single-sided printed wiring board 12, the wiring patterns 14, the insulating layer 16 and the fixation sheet 20 is the same as for the first embodiment, identical reference numbers are attached thereto.

In the second embodiment, because jumpers are not provided on a rear-surface of the single-sided printed wiring board 12, it is unnecessary to provide holes for connection on the single-sided printed wiring board 12. Consequently, the holes 12b and 12c in the first embodiment may not be provided in the single-sided printed wiring board 12 in the second embodiment. However, other parts, for example, the wiring patterns 14, have the same structure as in the first embodiment.

The insulating layer 16 for covering the wiring patterns 14 and the surface of the single-sided printed wiring board 12 is provided with openings 16e, 16f, 16g and 16h which correspond to connection parts for wiring patterns 14h, 14i, 14j and 14k connected by the overlapping first and second jumpers 32 and 34 and are arranged in a line as shown in FIG. 9. In other respects, the insulating layer 16 has the same structure as in the first embodiment.

The first jumper 32 is formed by printing in such a way that the openings 16f and 16g of the insulating layer 16 are filled with conductive paste and the conductive paste is interconnected on the insulating layer 16. As shown in FIG. 8, the wiring patterns 14i and 14j are connected by the first jumper 32 which straddles the wiring pattern 14m and the insulating layer 16 disposed on the wiring pattern 14m.

A first overcoat 36 having an insulation property is provided on the first jumper 32 by printing. The first overcoat 36 in the second embodiment is disposed to cover the first jumper 32 and almost the entire front surface of the single-sided printed wiring board 12 except for openings corresponding to patterns for contact springs or connection patterns for LEDs or the like similarly to the front-surface overcoat 26 in the first embodiment. Openings 36a and 36b for provision of second jumpers 34 are provided in portions of the first overcoat 36 corresponding to the openings 16e and 16h of the insulating layer 16.

The second jumper 34 is formed by printing conductive paste on the first overcoat 36 which is provided on the first jumper 32 and by filling the printed conductive paste in the openings 36a and 36b of the first overcoat 36 corresponding to the openings 16e and 16h.

As shown in FIG. 8, the wiring patterns 14h and 14k are electrically connected by the second jumper 34 which straddles the wiring patterns 14i, 14m and 14j and first overcoat 36 covering the wiring patterns 14i, 14m and 14j.

A second overcoat 38, which has an insulation property and is formed by printing, similarly to the first overcoat 36, is provided on the second jumper 34. The second overcoat 38 in the second embodiment is disposed on the second jumper 34 and the first overcoat 36. The second overcoat 38 also covers almost the entire surface of the first overcoat 36 except for the portions corresponding to the patterns for switching or connection patterns of LEDs or the like. In the second embodiment, the first and second overcoats 36 and 38 function as spacers in a similar way to the front-surface overcoat 26 in the first embodiment, and the fixation sheet 20 is fixed onto the second overcoat 38.

In the key sheet module having the above-mentioned structure in the second embodiment, the wiring patterns 14i and 14j sandwiching in the adjacent wiring patterns 14m therebetween are connected by the first jumpers 32, the wiring patterns 14h and 14k are connected by the second jumper 34 which straddles the wiring patterns 14i and 14j and the first overcoat 36 covering the wiring patterns 14*i* and 14*j* therebetween, and the first and second jumpers 32 and 34 are disposed to overlap in a plan view, as shown in FIG. 9. It is therefore possible to form a plurality of jumpers on previously formed other jumpers, thus preventing an increase in size of the key sheet module due to an increased number of jumpers and enhancing a degree of freedom in circuit design.

Also, in the second embodiment, because the jumpers are provided only on the front surface of the single-sided printed wiring board 12, all connections can be carried out by operations only from the front surface and the operation to fix the position of the board need only be performed once, thereby allowing a high operation efficiency to be achieved.

Meanwhile, in the second embodiment, although each of the second jumper 34 straddles the first jumper 32 by interposing an insulation layer therebetween, it is also possible to have a structure in which a single second jumper 34 straddles a plurality of first jumpers 32. Moreover, in the second embodiment, jumpers of two layers disposed on the front-surface of the single-sided printed wiring board are shown by use of the first jumper 32 and the second jumper 34, but one or more additional jumpers and overcoats may be disposed on the two layers to form a multiple layer structure. In addition, as shown in FIG. 9, the second jumper 34 is disposed to completely overlap with the first jumper 32, but of course only a part thereof may be overlapped and they may be disposed to intersect each other in a plan view.

Furthermore, the wiring patterns can be connected using a connection structure or a combination of the front-surface jumpers 22 and the rear-surface jumpers 24 according to the first embodiment and the connection structure of overlapping the first jumper 32 and the second 34 in a plan view according to the second embodiment.

In addition, in the key sheet module according to the present invention, because the second jumper 34 is provided on the first jumper 32 formed on the front surface of the single-sided printed wiring board 12, the number of jumpers can be increased to deal with a complicated circuit structure. Because the first and second jumpers 32 and 34 are disposed in a partly or fully overlapped state, it is possible to prevent the board from becoming larger due to the increased number of jumpers.

Also, because the first jumper 32 and the second jumper 34 are provided only on the front surface of the single-sided printed wiring board 12, all mounting and connection operations can be carried out by working only from the front surface, and the operation to fix the position of the single-sided printed wiring board 12 need only be performed once.

The key sheet module according to the present invention is used as an input section in a compact electronic instrument such as a mobile phone or the like, but effective use of the jumpers to deal with a complicated circuit structure makes it possible to increase the number of functions. Consequently, by installing not only key input function but also other information processing functions in the key sheet module, it is possible to use the structures in various instruments as a sheet module with an overall processing capability.

Although the preferred embodiments of the present invention have been explained, it should be noted that the present invention is not limited to these embodiments, and various modifications and changes can be made to the embodiments.

What is claimed is:

1. A key sheet module, comprising:
    a single-sided printed wiring board including a front surface on which a plurality of wiring patterns are provided and further including a plurality of holes which pass through the single-sided printed wiring board and are provided at positions corresponding to rear-surface connection parts of the wiring patterns;
    a plurality of contact springs disposed on the wiring patterns for switching of the wiring patterns;
    an insulating layer provided on the wiring patterns, and having openings provided at positions corresponding to the contact springs and front-surface connection parts of the wiring patterns, respectively;
    a front-surface jumper to electrically connect the front-surface connection parts exposed in the openings of the insulating layer; and
    a rear-surface jumper to electrically connect the rear-surface connection parts exposed in the holes of the single-sided printed wiring board;
    a fixation sheet to cover a surface of the contact spring.

2. The key sheet module according to claim 1,
    wherein a front-surface overcoat having an insulation property is provided on the front-surface jumper.

3. The key sheet module according to claim 1,
    wherein a rear-surface overcoat having an insulation property is provided on the rear-surface jumper.

4. The key sheet module according to claim 1,
    wherein the front-surface connection parts electrically connected by the front-surface jumper and the rear-surface connection parts electrically connected by the rear-surface jumper are provided respectively, and each of the jumpers straddles one or more other wiring patterns.

5. The key sheet module according to claim 1,
    wherein a plurality of front-surface jumpers, each of which electrically connects each of a plurality of the front-surface connection parts, are provided,
    wherein a plurality of rear-surface jumpers, each of which electrically connects each of a plurality of the rear-surface connection parts, are provided.

6. The key sheet module according to claim 4, wherein the front-surface jumper partly or fully overlaps the rear-surface jumper in a plan view.

7. A key sheet module, comprising:
    a single-sided printed wiring board including a front surface on which a plurality of wiring patterns are provided;
    a plurality of contact springs disposed on the wiring patterns for switching of the wiring patterns;
    an insulating layer provided on the wiring patterns, and having openings provided at positions corresponding to the contact springs and front-surface connection parts comprising a first and a second connection parts of the wiring patterns, respectively;
    a fixation sheet to cover a surface of the contact spring;
    a first jumper to electrically connect the first connection parts exposed in the openings of the insulating layer;
    a first overcoat having an insulation property and configured to cover the first jumper; and
    a second jumper provided on the first overcoat and configured to electrically connect the second connection parts exposed in the openings of the insulating layer.

8. The key sheet module according to claim 7,
    wherein the first overcoat having openings for the second connection parts is configured to cover the first jumper and a surface of the single-sided printed wiring board.

9. The key sheet module according to claim 7,
    wherein a second overcoat having an insulation property is provided on the second jumper.

10. The key sheet module according to claim 7,
    wherein the first connection parts of the wiring patterns are electrically connected by the first jumper straddling one or more other wiring patterns, wherein the second connection parts of the wiring patterns are electrically connected by the second jumper straddling one or more other wiring patterns.

11. The key sheet module according to claim 7, wherein a plurality of first jumpers, each of which electrically connects each of a plurality of the first connection parts, are provided, wherein a plurality of second jumpers, each of which electrically connects each of a plurality of the second connection parts, are provided.

12. The key sheet module according to claim 7, wherein the first jumper partly or fully overlaps the second jumper in a plan view.

* * * * *